United States Patent
Silverbrook

(10) Patent No.: US 6,978,613 B2
(45) Date of Patent: Dec. 27, 2005

(54) THERMAL BEND ACTUATOR

(75) Inventor: Kia Silverbrook, Balmain (AU)

(73) Assignee: Silverbrook Research PTY LTD, Balmain (AU)

( * ) Notice: Subject to any disclaimer, the term of this patent is extended or adjusted under 35 U.S.C. 154(b) by 0 days.

(21) Appl. No.: 10/258,518

(22) PCT Filed: May 2, 2001

(86) PCT No.: PCT/AU01/00501

§ 371 (c)(1),
(2), (4) Date: Oct. 25, 2002

(87) PCT Pub. No.: WO01/83363

PCT Pub. Date: Nov. 8, 2001

(65) Prior Publication Data

US 2003/0140627 A1 Jul. 31, 2003

(51) Int. Cl.$^7$ ................................................ F01B 29/10
(52) U.S. Cl. ........................................ 60/527; 60/528
(58) Field of Search .......................... 60/527, 528, 529; 347/47, 54, 56, 44; 310/306, 309

(56) References Cited

U.S. PATENT DOCUMENTS

| 5,058,856 | A | 10/1991 | Gordon et al. |
| 5,064,165 | A | 11/1991 | Jerman |
| 5,619,177 | A | 4/1997 | Johnson et al. |
| 5,739,832 | A | 4/1998 | Heinzl et al. |
| 5,825,275 | A | 10/1998 | Wuttig et al. |
| 6,211,598 | B1 | 4/2001 | Dhuler et al. |

FOREIGN PATENT DOCUMENTS

| EP | 0412221 | 2/1995 |
| GB | 2334000 A | 8/1999 |
| WO | WO 00/64804 | 11/2000 |
| WO | WO 01/15184 | 3/2001 |

*Primary Examiner*—Hoang Nguyen

(57) ABSTRACT

A thermal bend actuator (6) is provided with upper arms (23, 25, 26) and lower arms (27, 28) which are non planar, so increasing the stiffness of the arms. The arms (23, 25, 26, 27, 28) may be spaced transversely of each other and do not overly each other in plan view, so enabling all arms to be formed by depositing a single layer of arm forming material.

31 Claims, 3 Drawing Sheets

THERMAL BEND ACTUATOR

FIELD OF THE INVENTION

The present invention relates to the field of micro electromechanical devices such as ink jet printers. The present invention will be described herein with reference to Micro Electro Mechanical Inkjet technology. However, it will be appreciated that the invention does have broader applications to other micro electromechanical devices, e.g. micro electromechanical pumps or micro electromechanical movers.

BACKGROUND OF THE INVENTION

Micro electromechanical devices are becoming increasingly popular and normally involve the creation of devices on the $\mu$m (micron) scale utilising semiconductor fabrication techniques. For a recent review on micro-mechanical devices, reference is made to the article "The Broad Sweep of Integrated Micro Systems" by S. Tom Picraux and Paul J. McWhorter published December 1998 in IEEE Spectrum at pages 24 to 33.

One form of micro electromechanical devices in popular use are ink jet printing devices in which ink is ejected from an ink ejection nozzle chamber. Many forms of ink jet devices are known.

Many different techniques on ink jet printing and associated devices have been invented. For a survey of the field, reference is made to an article by J Moore, "Non-Impact Printing: Introduction and Historical Perspective", Output Hard Copy Devices, Editors R Dubeck and S Sherr, pages 207–220 (1988).

Recently, a new form of ink jet printing has been developed by the present applicant, which is referred to as Micro Electro Mechanical Inkjet (MEMJET) technology. In one form of the MEMJET technology, ink is ejected from an ink ejection nozzle chamber utilising an electro mechanical actuator connected to a paddle or plunger which moves towards the ejection nozzle of the chamber for ejection of drops of ink from the ejection nozzle chamber.

In previous designs of actuator a lower arm is deposited as a generally planar single layer, a sacrificial spacing layer is formed and then an upper arm is deposited as a generally planar layer.

A major portion of the cost of a manufactured wing semiconductor manufacturing techniques device depends on the number of separate layers required to be deposited during fabrication. Reducing the number of separate layers that need to be deposited reduces the cost of the device.

The efficiency of the thermal actuator is roughly inversely proportional to the mass of the actuator material. The actuator arms need to have a certain stiffness. If the stiffness of the arms can be maintained whilst decreasing mass, the efficiency of the actuator can be improved.

The present invention, in preferred forms, aims to address either or both of these issues.

SUMMARY OF THE INVENTION

In one aspect of the invention there is provided a thermal actuator which may be manufactured with material for upper and lower arm sets being deposited in a single step. This is achieved by having the arms arranged in a non-overlapping manner.

Accordingly, in one aspect the invention provides a thermal actuator for micro mechanical or micro electromechanical devices, the actuator including:

a supporting substrate, an actuator extension portion, a plurality of actuator arms comprising at least one first arm and at least one second arm spaced apart from the first arm, the at least one first arm attached at a first end thereof to the substrate and at a second end to the extension portion, the first arm being arranged, in use, to be conductively heatable, at least one second arm attached at a first end to the supporting substrate and at a second end to the extension portion, the first arm being arranged, in use, to undergo thermal expansion, thereby causing the actuator to apply a force to the extension portion, and wherein, in plan view, said plurality of actuator arms do not overlap each other.

In a second aspect of the invention there is provided a thermal actuator having at least one of the upper and lower arms including stiffening means.

Accordingly a second aspect of the invention provides a thermal actuator for micro mechanical or micro electromechanical devices, the actuator including:

a supporting substrate, an actuator extension portion, at least one first arm attached at a first end thereof to the substrate and at a second end to the extension portion, the first arm being arranged, in use, to be conductively heatable, at least one second arm attached at a first end to the supporting substrate and at a second end to the extension portion, the second arm being spaced apart from the first arm, the first arm being arranged, in use, to undergo thermal expansion, thereby causing the actuator to apply a force to the extension portion, and wherein, in transverse cross-section, at least one of the first arm and the second arm are non-planar in order to increase the bending resistance.

In transverse cross-section both the first and second arms may be non-planar.

The actuator preferably includes two first arms electrically interconnected at the second end and preferably includes three second arms. However, other combinations of upper and lower arms are within the scope of the invention.

The at least one first arm and at least one second arm may be spaced transversely relative to each other and preferably in plan view do not overlap.

The edges of the first and second arms may be located in a common plane.

Where edges of the first and second arms are located in a common plane the first arm preferably has a centre of inertia located to one side of the common plane and the second arm preferably has a centre of inertia located to the other side of the common plane.

In transverse cross-section the at least one first arm and/or the at least one second arm may include an edge portion extending away from the other arm. The edge portion may extend inwardly.

In transverse cross-section the at least one first arm or the at least one second arm, or both, may have a U, V, C or W profile.

In a third aspect of the invention there is provided a method of manufacturing a thermal actuator in which material for upper and lower arms is deposited in a single step.

Accordingly a third aspect of the invention provides a method of forming a thermal actuator including the steps of:

a) depositing a first layer of sacrificial material;

b) depositing at least a second layer of sacrificial material on a selected part or parts of the first layer;

c) depositing an actuator forming layer of material over the first and second layers of sacrificial layers; and d) selectively removing portions of the actuator forming material to form at least one first arm deposited on the first layer and at least one second arm deposited on at least part of the second layer.

Step b) may include depositing one or more additional layers of sacrificial material on selected parts of the second layer.

The additional layer or layers may be deposited on only part of the second layer.

The at least one first arm so formed may be planar or non planar. In transverse cross-section the at least one first arm or the at least one second arm, or both, may have a U, V, C or W profile.

The layers may be deposited so that, when formed, the transverse edges of the at least one first arm lie in a first plane and the transverse edges of the at least one second arm lie in a second plane. The first and second planes may lie in a common plane.

In plan view the at least one first arm and the at least one second arm may overlap or may be spaced transversely to each other.

In plan view when there are at least two first or second arms the arms alternate.

In the preferred embodiments, an improved thermal bend actuator is formed through the depositing and etching of a number of layers with the actuator arms being in the form of a corrugated or non planar structure so as to provide for increased stiffness in the bending direction. The corrugated titanium nitride layer of the thermal bend actuator is defined utilising standard lithographic steps and in a number of embodiments is of such a nature that the masking edges occur on the same planar layer such that all edges will be simultaneously within the depth of field of a stepper process.

It is important that the arms of an actuator have sufficient stiffness to avoid buckling. For a given stiffness the efficiency of the thermal actuator is roughly inversely proportional to the mass of the actuator material. The utilization of a corrugated or non-planar structure provides for improved stiffness characteristics for a given thermal mass. The corrugations achieve a higher stiffness without increasing the thickness and thereby increasing the mass of the actuator. This provides an overall increase in efficiency. Generally, simulations indicate efficiency increases of around 50% are possible.

In the preferred embodiment, a thermal bend actuator is formed by the deposition of a single layer of titanium nitride so as to form spaced-apart actuator arms which do not coincide in a vertical plane. The advantage of utilising a single layer of out of plane actuator is that the number of layers to be deposited and patterned in the structure are substantially reduced.

BRIEF DESCRIPTION OF THE DRAWINGS

Notwithstanding any other forms which may fall within the scope of the present invention, preferred forms of the invention will now be described, by way of example only, with reference to the accompanying drawings, in which.

DESCRIPTION OF PREFERRED AND OTHER EMBODIMENTS

Figure 1:
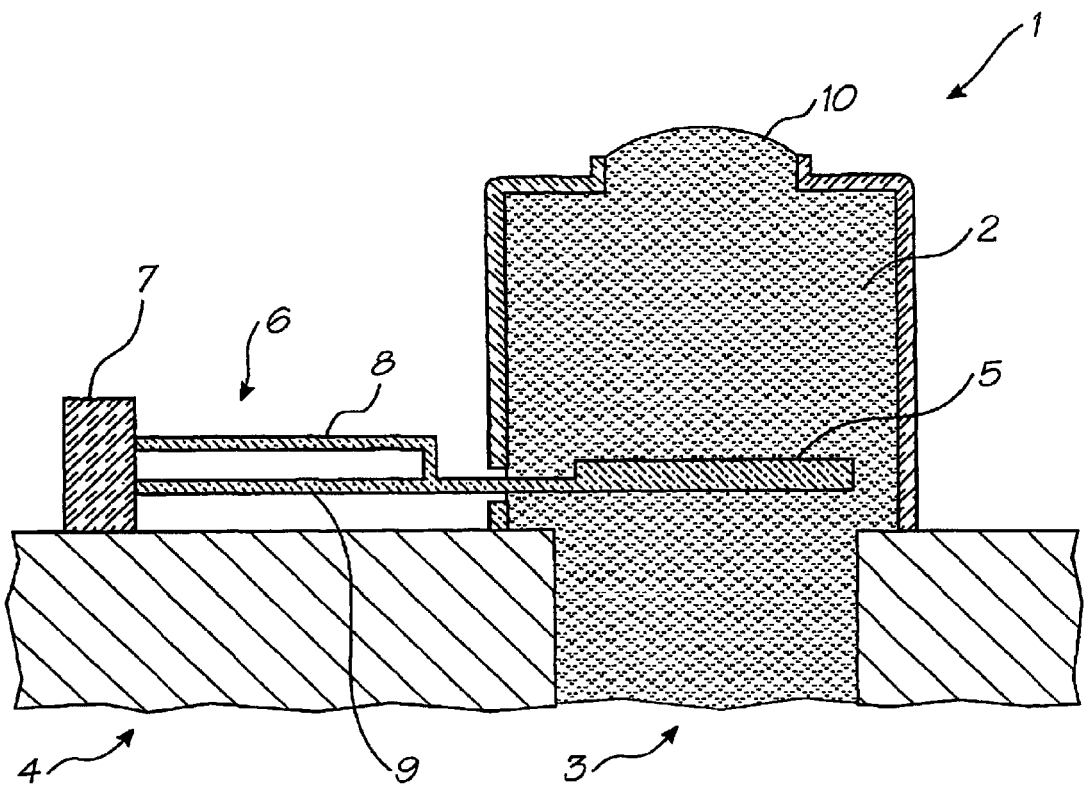
FIG. 1 shows, in schematic form, the operation of a thermal bend actuator ink jet printing device.

The basic operational principles of a liquid section which utilises a thermal actuator device will be explained with reference to FIG. 1. It is to be understood that the thermal actuator of the invention is not limited to use in such liquid ejection devices. As shown in FIG. 1, there is provided an ink ejection arrangement 1 which comprises a nozzle chamber 2 which is normally filled with ink so as to form a meniscus 10 around an ink ejection nozzle 11 having a raised rim. The ink within the nozzle chamber 2 is resupplied by means of ink supply channel 3.

The ink is ejected from a nozzle chamber 2 by means of a thermal actuator 7 which is rigidly interconnected to a nozzle paddle 5. The thermal actuator 7 comprises two arms 8, 9 with the bottom arm 9 being interconnected to an electrical current source so as to provide conductive heating of the bottom arm 9. When it is desired to eject a drop from the nozzle chamber 2, the bottom arm 9 is heated so as to cause rapid expansion of this arm 9 relative to the top arm 8. The rapid expansion in turn causes a rapid upward movement of the paddle 5 within the nozzle chamber 2. This initial movement causes a substantial increase in pressure within the nozzle chamber 2 which in turn causes ink to flow out of the nozzle 11 causing the meniscus 10 to bulge. Subsequently, the current to the heater 9 is turned off so as to cause the paddle 5 to begin-to return to its original position. This results in a substantial decrease in the pressure within the nozzle chamber 2. The forward momentum of the ink outside the nozzle rim 11 results in a necking and breaking of the meniscus so as to form a meniscus and a bubble of ink 18. The bubble 18 continues forward onto the ink print medium as the paddle returns toward its rest state. The meniscus then returns to the position shown in FIG. 1, drawing ink past the paddle 5 in to the chamber 2. The wall of the chamber 2 forms an aperture in which the paddle 5 sits with a small gap there between.

Figure 2:
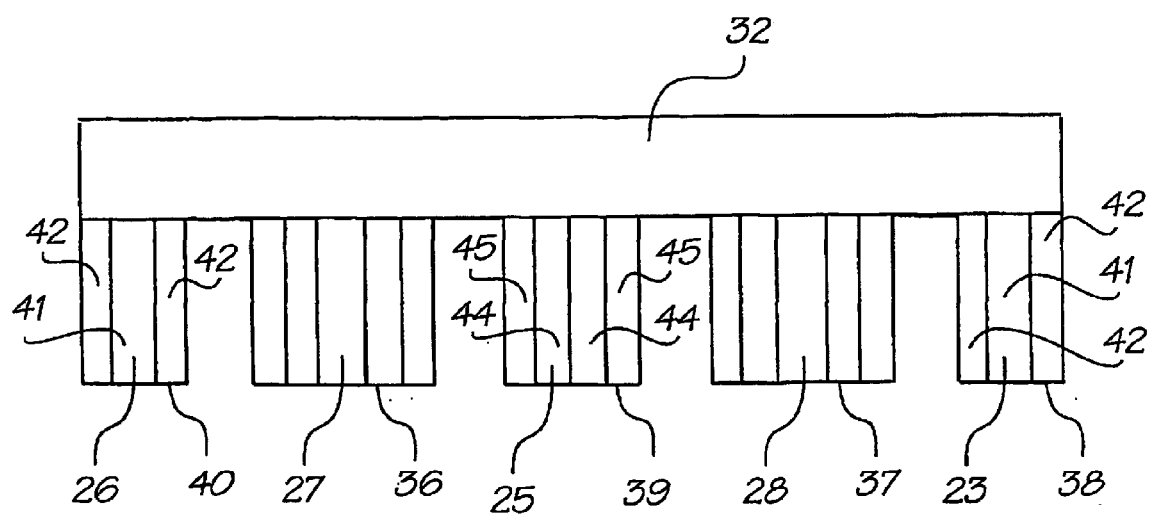
FIG. 2 shows a plan view of thermal bend actuator of a first embodiment of the invention.
Figure 3:
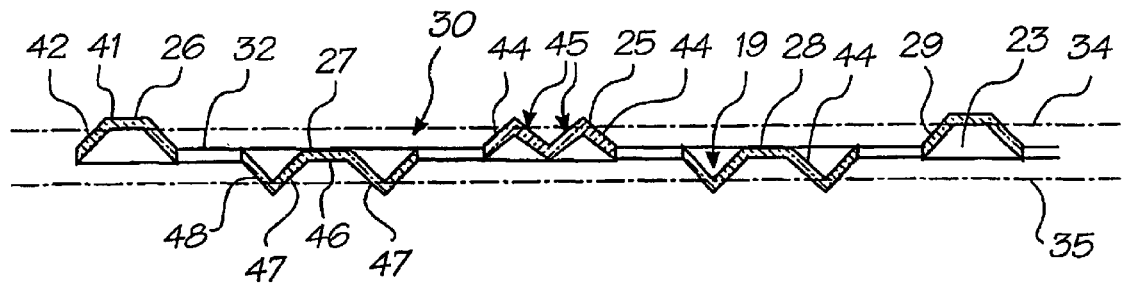
FIG. 3 shows a cross-section of a thermal bend actuator of the first embodiment of the invention.

FIGS. 2 and 3 show a first embodiment of a thermal bend actuator according to the invention.

The actuator has two lower arms, 27, 28 and three upper arms, 23, 25 and 26. All of the arms are formed as a unitary structure and are joined by an integral cross arm 32.

As best seen in FIG. 3, the edges of the upper and lower arms are located in a common plane 33. However, the lower arms 27, 28 are configured so as to extend below the common plane 33 whilst upper arms 23, 25, 26 extend above the common plane. The result is that the longitudinal centre of inertia for the upper arms is above the plane 33 and the longitudinal centre of inertia for the lower arms is below the plane, as indicated by lines 34 and 35 respectively.

The free ends 36, 37 of the lower arms are selectively connected to an electrical power source which causes current to pass from arm 27, into cross arm 32 and then into arm 28 (or vice versa), causing resistive heating of arms 27 and 28. The free ends 38, 39, 40 of arms 23, 25, 26 respectively are not connected to the electrical circuit so current does not flow into them. Thus, the arms 23, 25, 26 are not heated and do not expand. Ends 36, 37, 38, 39 and 40 are secured to an anchor block (not shown) so the thermal expansion in the length of the lower arms 27 and 28 results in an upward bending of the actuator as a whole about the anchor block. This, in turn, causes movement of whatever device, such as an ink ejection paddle, is connected to the actuator.

In cross-section outer arms 23 and 26 have a central horizontal portion 41 and two downwardly extending portions 42, which extend symmetrically downwards to the common plane 33.

The central arm 25 has, in cross section, two outer portions 44 and two inner portions 45. The two inner portions 45 extend symmetrically outwards and upwards relative to each other and the centre line of the arm 25. The outer portions 44 then extend downwardly and outwardly relative to the two inner portions to extend to the common plane 33.

The two lower arms 27 and 28 are identical and include a central portion 46 located in the common plane 33, two intermediate portions 47 extending downwardly from the central portion 46 and then two outer portions 48 extending upwardly to the common plane 33.

The two lower arms 27 and 28 are spaced equally between the central upper arm 25 and the outer arms 26 and 23 respectively so that arm 25 lies in the centre of the actuator as a whole. The total cross sectional area of the three upper arms 23, 25 and 26 is equal to the total cross sectional area of the two lower arms 27 and 28, but this is not essential. It will be appreciated that the non planar arms have a greater stiffness and hence resistance to bending compared to arms of the same cross sectional area.

Figure 4:
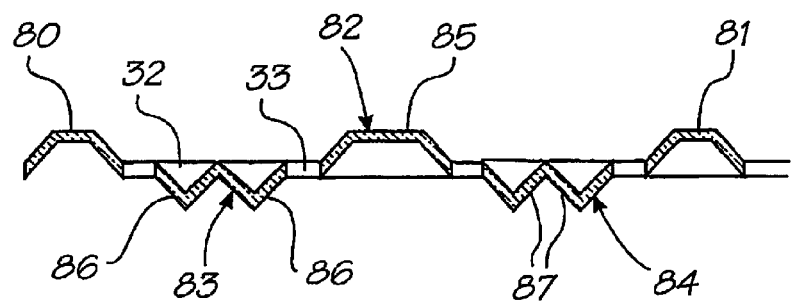
FIG. 4 shows a cross-section of a thermal bend actuator of a second embodiment of the invention.

FIG. 4 shows a cross-section of a second embodiment in which there are provided three upper arms and two lower arms. In plan view the configuration of the arms is the substantially the same as that shown in FIG. 2 for the first embodiment. The embodiment of FIG. 4 only differs in the cross sectional profile of the upper and lower arms.

The outer upper arms 80 and 81 have the same profile as arms 23 and 26 of the first embodiment. The central upper arm 82 is also similar to the outer arms 23 and 26 of the first embodiment in that it has a central portion with two outwardly and downwardly extending portions which terminate at the common plane 33. It will be noted that the width of the central portion 85 of arm 82 is greater than that of the two outer arms 80 and 81, but this is not essential and all three upper arms may be identical in cross section, if desired.

The two lower arms 83 and 84 are similar to those of the first embodiment but lack a central portion. Instead, outer portions 86 extend inwardly and downwardly from the common plane 33 to meet with inner portions 87 which extend outwardly and downwardly from the common plane 33 to form a W shape.

The arrangement of actuator arm cross-sections, as shown in FIGS. 2 and 3, provides for an increased stiffness in the thermal bend actuator without increasing the thickness of the layer through the corrugated nature of the actuator arms and reduces the occurrence of buckling during operation of the thermal bend actuator compared to an actuator with planar arms of the same total cross sectional area. This allows the cross sectional area, and hence mass, to be reduced, so increasing efficiency. In addition this allows stiffness to be increased to reduce the risk of buckling, with or without a reduction in mass.

As all the edges of the upper and lower arms are in the same plane, this provides for an increase in the exposure precision and allows either the actuator arms to be brought closer together than would be otherwise possible or to utilise equipment having a smaller depth of field (modern stepper equipment often operates over a depth of field of approximately 0.5 microns). In addition, as will be explained below, this also allows, in preferred embodiments for a simplified manufacturing process.

Whilst the total cross-sectional areas of the upper and lower arms in the two embodiments are similar, it is to be appreciated that the exact shape, cross section of each arm or total cross sectional area is not critical so long as the upper arms as a whole bend about an axis vertically distant from the axis about which the lower arms bend. Further whilst the edges of the arms preferably lie in a common plane, this is not essential.

In both of the embodiments described the effective moment of inertia and/or mass of the upper arms is preferably equal to that of the lower arms for optimum efficiency. However, this is not essential and the effective moment of inertia and/or mass of the two sets of arms may be different. In addition the centres of inertia of the two sets of arms may be at unequal distances from the common plane 33.

It is also to be appreciated that the invention is not limited to the number of upper arms being in a ratio of 3:2 to the number of lower arms. For example, without limiting the scope of the invention, ratios of 2:2, 5:3, 4:4 are acceptable.

Figure 6:
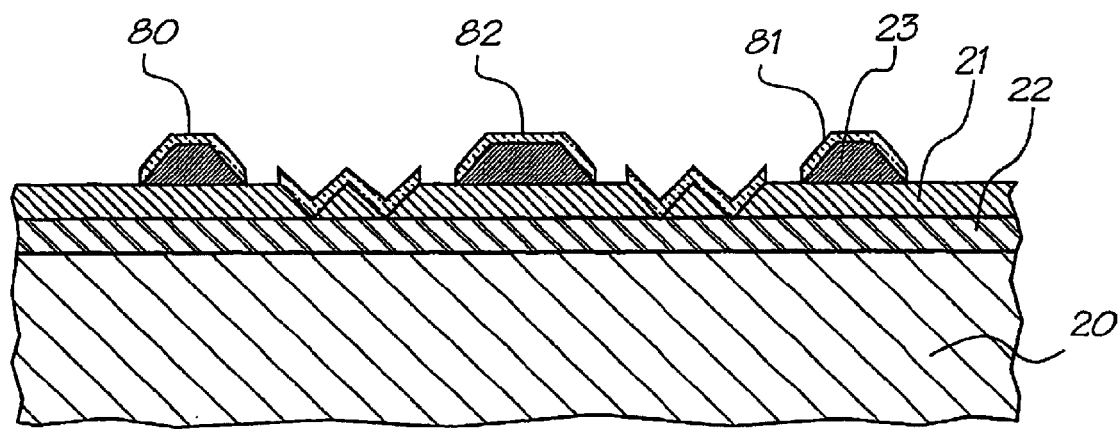
FIG. 6 shows a cross-section of a thermal bend actuator according to the second embodiment partway through the manufacturing process.
Figure 7:
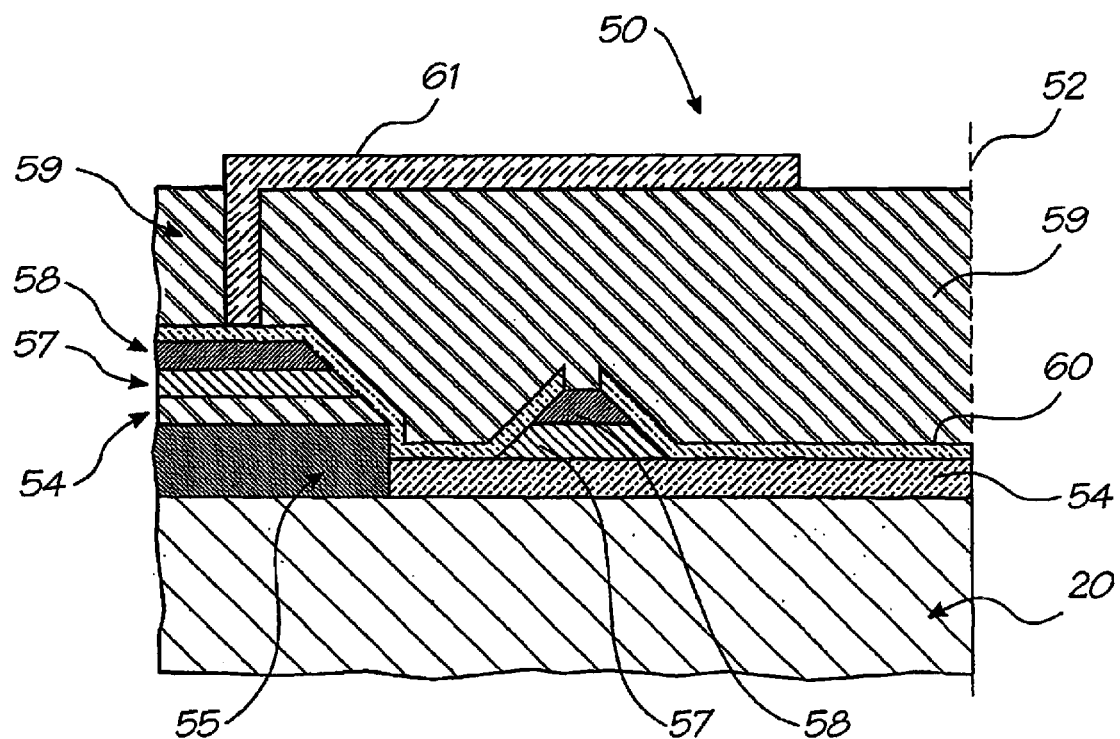
FIG. 7 illustrates a sectional view through a portion of a nozzle chamber which is formed simultaneously with the formation of the thermal bend actuator.

Manufacture of the thermal band actuator according to the invention will be described with reference to FIGS. 5 and 7 which shows cross sections of a partially fabricated ink ejection device utilising a thermal band actuator according to the first embodiment. FIG. 6 also shows a partially fabricated thermal bend actuator according to the second embodiment of the invention. The process steps of manufacture of the first and second embodiments are the same and it is only the design of the masks used that differentiate the end product.

Figure 5:
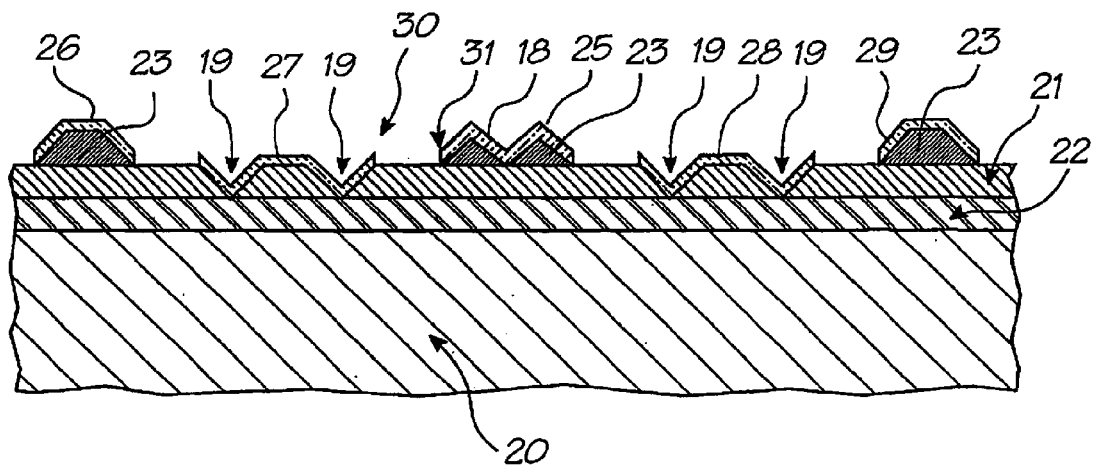
FIG. 5 shows a cross-section of a thermal bend actuator according to the first embodiment partway through the manufacturing process.

Referring to FIG. 5, the manufacturing steps for the formation of the thermal bend actuator include the following steps:

1. A CMOS wafer 20 is provided having the required electrical control structures formed thereon;
2. A first sacrificial layer 22 is deposited and etched to form a generally planar spacer layer. The layer 22 is preferably deposited as a 2 microns thick layer of photoimageable polyamide (PI) by spinning on the layer. The layer is then exposed through a first mask, developed and etched so as to remove unexposed regions and then hard-baked. During the hard-bake stage, the PI shrinks to 1 micron thickness.
3. A second sacrificial layer 21 is deposited on selected areas of the first layer in the same manner as step 2, but utilising a different mask. The second layer 21 does not extend over all of the first layer but is laid so as to have gaps 19 between portions. On baking the PI layer shrinks and, as is its nature, it forms side walls which are angled at about 45□ to the general horizontal plane on either side of the gaps 19. In the drawings the gaps 19 are shown as having minimal width at the interface with the first layer 22. However it is to be appreciated that the gaps 19 may have a significant width at the interface with the first layer 22;
4. A third sacrificial layer 23 is then deposited onto selected areas of the second layer 21 to form three arms. Again the edges become angled upon baking in the same manner as in step 2;

5. A single 0.25 micron layer of titanium nitride 18 is then deposited to cover all of the exposed first, second and third sacrificial layers 21, 22, 23. The titanium nitride layer is then etched by known means to remove material between the intended arms and to form gaps between the arms and pattern the layer 18 so as to form a thermal bend actuator having the cross-section of either FIG. 3 or FIG. 4, depending upon the mask pattern design in previous steps;

6. A fourth sacrificial layer 59 of 6 micron thickness is then deposited so as to form a sacrificial structure for a nozzle chamber;

7. A 1 micron layer of dielectric material 61 forming the nozzle chamber 2, is deposited;

8. Subsequently, a 1 micron layer of sacrificial material comprising the fifth sacrificial layer (not shown) is deposited;

9. A subsequent layer (not shown) is also deposited to form a nozzle rim, with the etch preferably being an anisotropic etch so as to leave a thin nozzle rim structure around the nozzle chamber, 10. A nozzle guard structure (not shown), if required, is attached to the substrate. The nozzle guard structure can be independently micromachined to mate with the substrate;

11. The nozzle guard is then affixed to UV-sensitive adhesive tape;

12. The CMOS wafer is then back etched utilising a Bosch etching process to separate the wafer into printhead segments and to form an ink channel supply channel to the nozzle chamber; and 13. the UV tape is then exposed to light so as to reduce its adhesiveness and to leave individual printhead segments which can be picked and placed for testing.

In the above process the titanium nitride layer for both sets of arms is laid down in one step. This results in a reduction in the process steps compared to depositing material for the two sets of arms sequentially. Further more the spacing of edges of adjacent arms is only limited by the accuracy of the stepper used.

The above steps simultaneously form both the thermal bend actuator and the nozzle chamber and paddle. For example, in FIG. 7, there is shown a portion 50 of the nozzle chamber (which is symmetrical around an axis 52). On the wafer 20 is formed the CMOS layer 55. The first sacrificial layer 54 is deposited and etched as are the second 57 and third 58 sacrificial layers. On top of the sacrificial layers is deposited a titanium nitride layer 60, which includes portions forming the paddle as well as the actuator. A subsequent fourth sacrificial layer 59 is deposited and etched. This is followed by a dielectric layer 61 which is deposited and etched so as to form the nozzle chamber proper. Subsequently, the sacrificial layers are etched away so as to release the bend actuator and simultaneously release the paddle structure.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

What is claimed is:

1. A thermal actuator for micro mechanical or micro electromechanical devices, the actuator including:
    a) a supporting substrate,
    b) an actuator extension portion,
    c) at least one elongate first arm attached at a first end thereof to the substrate and at a second end to the extension portion, the first arm being arranged, in use, to be conductively heatable,
    d) at least one elongate second arm attached at a first end to the supporting substrate and at a second end to the extension portion, the second arm being spaced apart from the first arm,
    the at least one first arm being arranged, in use, to undergo thermal expansion, thereby causing the actuator to apply a force to the extension portion, and
    wherein, in transverse cross-section, at least one of the at least one first arm and the at least one second arm is corrugated.

2. An actuator of claim 1 wherein, in transverse cross-section, both the first and second arms are non-planar.

3. An actuator of claim 1 wherein the at least one first arm and at least one second arm are spaced transversely relative to each other and, in plan view, do not overlap.

4. The actuator of claim 1 wherein the transverse edges of the first and second arms are located in a common plane.

5. The actuator of claim 4 wherein the first arm has a centre of inertia located to one side of the common plane and the second arm has a centre of inertia located to the other side of the common plane.

6. An actuator of claim 1 wherein, in transverse cross-section, a first arm or a second arm includes an edge portion extending away from the other of the second and first arm.

7. The actuator of claim 6 wherein, in transverse cross-section, the edge portion extends inwardly.

8. The actuator of claim 1, wherein the first arm or the second arm, or both, has, in transverse cross-section, a U, V, C or W profile.

9. An actuator of claim 1 including two first arms electrically interconnected at the second end.

10. An actuator of claim 1 including three second arms.

11. An actuator of claim 1 wherein the at least one first arm and the at least one second arm are formed as an integral unit, said first and second arms being joined at the second end to a transversely extending cross arm.

12. A thermal actuator for micro mechanical or micro electromechanical devices, the actuator including:
    a) a supporting substrate,
    b) an actuator extension portion,
    c) at least one first arm attached at a first end thereof to the substrate and at a second end to the extension portion, the first arm being arranged, in use, to be conductively heatable,
    d) at least one second arm attached at a first end to the supporting substrate and at a second end to the extension portion, the second arm being spaced apart from the first arm,
    the at least one first arm being arranged, in use, to undergo thermal expansion, thereby causing the actuator to apply a force to the extension portion,
    wherein, in plan view, said at least one first arm and said at least one second arm do not overlap, and
    wherein, in transverse cross-section, at least one of the at least one first arm and the at least one second arm is corrugated.

13. An actuator of claim 12 wherein, in transverse cross-section, the at least one first arm is non-planar.

14. An actuator of claim 12 wherein, in transverse cross-section, the at least one second arm is non-planar.

15. The actuator of claim 12 wherein the transverse edges of the at least one first and at least one second arms are located in a common plane.

16. The actuator of claim 15 wherein the first arm has a centre of inertia located to one side of the common plane and the second arm has a centre of inertia located to the other side of the common plane.

17. An actuator of claim 12 wherein in transverse cross-section, a first arm or a second arm includes an edge portion extending away from the other arm.

18. The actuator of claim 17 wherein, in transverse cross-section, the edge portion extends inwardly.

19. The actuator of claim 12, wherein the at least one first arm or the at least one second arm, or both, has, in transverse cross-section, a U, V, C or W profile.

20. An actuator of claim 12 including two first arms electrically interconnected at the second end.

21. An actuator of claim 12 including three second arms.

22. An actuator of claim 1 wherein the at least one first arm and the at least one second arm are formed as an integral unit, said first and second arms being joined at the second end to a transversely extending cross arm.

23. A method of forming a thermal actuator including the steps of:
   a) depositing a first layer of sacrificial material;
   b) depositing at least a second layer of sacrificial material on a selected part or parts of the first layer;
   c) depositing an actuator forming layer of material over the first and second layers of sacrificial layers; and
   d) selectively removing portions of the actuator forming material to form at least one first arm deposited on the first layer and at least one second arm deposited on at least part of the second layer.

24. The method of claim 23 wherein step b) includes depositing one or more additional layers of sacrificial material on selected parts of the second layer.

25. The method of claim 24 wherein the additional layer or layers are deposited on only part of the second layer.

26. The method of claim 23 wherein the at least one first arm is non planar.

27. The method of claim 23 wherein the at least one second arm is non planar.

28. The method of claim 23 wherein, in transverse cross-section, the at least one first arm or the at least one second arm, or both, have a U, V, C or W profile.

29. The method of claim 23 wherein, when formed, the transverse edges of the at least one first arm lie in a first plane.

30. The method of claim 23 wherein, when formed, the transverse edges of the at least one second arm lie in a second plane.

31. The method of claim 23 wherein, when formed, the transverse edges of the at least one first arm lie in a first plane and the transverse edges of the at least one second arm lie in a second plane, said first and second planes being in a common plane.

* * * * *